United States Patent
Kim et al.

(10) Patent No.: US 8,659,016 B2
(45) Date of Patent: Feb. 25, 2014

(54) THIN FILM TRANSISTOR, METHOD OF MANUFACTURING THE SAME AND FLAT PANEL DISPLAY DEVICE HAVING THE SAME

(71) Applicant: Samsung Display Co., Ltd., Yongin (KR)

(72) Inventors: Min-Kyu Kim, Youngin (KR); Jong-Han Jeong, Youngin (KR); Tae-Kyung Ahn, Youngin (KR); Jae-Kyeong Jeong, Youngin (KR); Yeon-Gon Mo, Youngin (KR); Jin-Seong Park, Youngin (KR); Hyun-Joong Chung, Youngin (KR); Kwang-Suk Kim, Youngin (KR); Hui-Won Yang, Youngin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/889,752

(22) Filed: May 8, 2013

(65) Prior Publication Data
US 2013/0240879 A1 Sep. 19, 2013

Related U.S. Application Data

(62) Division of application No. 13/091,614, filed on Apr. 21, 2011, now Pat. No. 8,541,258, which is a division of application No. 12/424,860, filed on Apr. 16, 2009, now Pat. No. 7,994,500.

(30) Foreign Application Priority Data

Jun. 30, 2008 (KR) .................. 10-2008-0062417

(51) Int. Cl.
*H01L 29/10* (2006.01)
*H01L 29/12* (2006.01)

(52) U.S. Cl.
USPC .............. 257/43; 257/258; 257/E29.094

(58) Field of Classification Search
USPC ............ 257/43, 258, 646, E29.094, E21.476; 438/104, 149, 158
See application file for complete search history.

(56) References Cited

U.S. PATENT DOCUMENTS

| 2003/0047785 A1 | 3/2003 | Kawasaki et al. |
| 2005/0173734 A1 | 8/2005 | Yoshioka et al. |

(Continued)

FOREIGN PATENT DOCUMENTS

| JP | 2003-086808 | 3/2003 |
| JP | 2004-273614 | 9/2004 |

(Continued)

OTHER PUBLICATIONS

Office Action dated Aug. 26, 2009, in European Patent Application No. 09251688.9.

(Continued)

*Primary Examiner* — Chuong A Luu
*Assistant Examiner* — Nga Doan
(74) *Attorney, Agent, or Firm* — H.C. Park & Associates, PLC

(57) ABSTRACT

A thin film transistor (TFT) using an oxide semiconductor as an active layer, a method of manufacturing the TFT, and a flat panel display device having the TFT include source and drain electrodes formed on a substrate; an active layer formed of an oxide semiconductor disposed on the source and drain electrodes; a gate electrode; and an interfacial stability layer formed on at least one of top and bottom surfaces of the active layer. In the TFT, the interfacial stability layer is formed of an oxide having a band gap of 3.0 to 8.0 eV. Since the interfacial stability layer has the same characteristics as a gate insulating layer and a passivation layer, chemically high interface stability is maintained. Since the interfacial stability layer has a band gap equal to or greater than that of the active layer, charge trapping is physically prevented.

8 Claims, 9 Drawing Sheets

(56) References Cited

U.S. PATENT DOCUMENTS

| | | | |
|---|---|---|---|
| 2006/0244107 A1 | 11/2006 | Sugihara et al. | |
| 2007/0069209 A1 | 3/2007 | Jeong et al. | |
| 2008/0277658 A1* | 11/2008 | Lee et al. | 257/43 |
| 2008/0303020 A1* | 12/2008 | Shin et al. | 257/43 |
| 2009/0045397 A1* | 2/2009 | Iwasaki | 257/43 |
| 2009/0236596 A1 | 9/2009 | Itai | |
| 2009/0321731 A1 | 12/2009 | Jeong et al. | |
| 2010/0117999 A1 | 5/2010 | Matsunaga et al. | |

FOREIGN PATENT DOCUMENTS

| | | |
|---|---|---|
| JP | 2005-033172 | 2/2005 |
| JP | 2007-073561 | 3/2007 |
| JP | 2007-096126 | 4/2007 |
| JP | 2008-141119 | 6/2008 |
| JP | 2008-276212 | 11/2008 |
| JP | 2009-231613 | 10/2009 |
| KR | 1998-65168 | 10/1998 |
| KR | 10-272260 | 8/2000 |
| KR | 2003-10122 | 2/2003 |
| KR | 2007-31090 | 3/2007 |
| KR | 2007-35373 | 3/2007 |
| KR | 2007-105925 | 10/2007 |
| KR | 2008-2414 | 1/2008 |
| WO | 2008/069056 | 6/2008 |
| WO | 2008/069286 | 6/2008 |

OTHER PUBLICATIONS

Office Action issued by Korean Intellectual Property Office in Korean Patent Application No. 10-2008-0062417 on Dec. 5, 2009.

Korean Office Action dated May 27, 2010, issued in Korean Patent Application No. 10-2008-0062418.

Office Action issued in Chinese Patent Application No. 200910138568.9 on Jul. 13, 2010.

Non-Final Office Action of Nov. 17, 2010 in U.S. Appl. No. 12/424,860.

Notice of Allowance of Apr. 25, 2011 in U.S. Appl. No. 12/424,860.

Notice of Allowance issued to U.S. Appl. No. 13/091,614 dated Jul. 8, 2013.

* cited by examiner

US 8,659,016 B2

THIN FILM TRANSISTOR, METHOD OF MANUFACTURING THE SAME AND FLAT PANEL DISPLAY DEVICE HAVING THE SAME

CROSS-REFERENCE TO RELATED APPLICATIONS

This application is a divisional of U.S. application Ser. No. 13/091,614, filed on Apr. 21, 2011, which is a divisional of U.S. application Ser. No. 12/424,860, filed on Apr. 16, 2009, now U.S. Pat. No. 7,994,500, and claims priority from and the benefit of Korean Patent Application No. 10-2008-0062417, filed on Jun. 30, 2008, all of which are incorporated herein by reference.

BACKGROUND OF THE INVENTION

1. Field of the Invention

Aspects of the present invention relate to a thin film transistor using an oxide semiconductor as an active layer, a method of manufacturing the same and a flat panel display device having the same. More particularly, aspects of the present invention relate to a thin film transistor having an interfacial stability layer formed on one surface or both surfaces of an active layer, a method of manufacturing the same and a flat panel display device having the same.

2. Description of the Related Art

In general, a thin film transistor (TFT) includes an active layer providing channel, source and drain regions, and a gate electrode formed on the channel region and electrically isolated from the active layer by a gate insulating layer.

The active layer of the TFT configured as described above is generally formed of a semiconductor material such as amorphous silicon or poly-silicon. However, if the active layer is formed of amorphous silicon, mobility is low, and therefore, it is difficult to operate a driving circuit at a high speed. If the active layer is formed of poly-silicon, mobility is high while a threshold voltage is not uniform. Therefore, a separate compensation circuit should be added.

Since a conventional method of manufacturing a TFT using low temperature poly-silicon (LTPS) involves a high-cost process such as laser heat treatment, equipment investment and management costs are high, and it is difficult to apply the conventional method to a large-sized substrate.

In order to solve such a problem, studies on an oxide semiconductor used as an active layer have recently been conducted.

A TFT using a zinc oxide (ZnO) or oxide semiconductor having ZnO as a main component as an active layer has been disclosed in Japanese Laid-open Publication No. 2004-273614.

The oxide semiconductor having ZnO as a main component is estimated to be a stable material because of its amorphous state and high mobility. If such an oxide semiconductor is used as an active layer, a TFT can be manufactured using a conventional equipment without additionally purchasing separate processing equipment. The oxide semiconductor is deposited at a low temperature, and ion implantation is not required. Further, the oxide semiconductor is deposited using a sputtering method. Therefore, the oxide semiconductor can be applied to a large-sized substrate.

However, since a TFT using an oxide semiconductor as an active layer has electrical characteristics that are easily changed depending on structures of the TFT and processing conditions, reliability may be lowered. Particularly, when the TFT is driven by constant-voltage or constant-current, a threshold voltage is changed in a positive (+) direction depending on time. It is estimated that such a phenomenon is caused by charge trapping due to the deterioration of an interface between an active layer and an insulating layer, or an active layer and a passivation layer.

SUMMARY OF THE INVENTION

Aspects of the present invention provide a thin film transistor (TFT) capable of improving interfacial characteristics of an active layer, a method of manufacturing the same, and a flat panel display device having the same.

Aspects of the present invention provide a TFT capable of preventing charge trapping in an interface of an active layer, a method of manufacturing the same, and a flat panel display device having the same.

Aspects of the present invention provide a TFT having high electrical characteristics and reliability, a method of manufacturing the same, and a flat panel display device having the same.

According to an aspect of the present invention, a TFT includes: a substrate; source and drain electrodes formed on the substrate; an active layer formed of an oxide semiconductor and formed to at least partially overlap both of the source and drain electrodes; a gate insulating layer formed on the substrate to cover the active layer and the source and drain electrodes; a gate electrode formed on the gate insulating layer and insulated from the active layer by the gate insulating layer; and an interfacial stability layer formed on one or both of top and bottom surfaces of the active layer, wherein the interfacial stability layer is formed of an oxide having a band gap of 3.0 to 8.0 eV.

According to another aspect of the present invention, a method of manufacturing a TFT includes: forming source and drain electrodes on a substrate; sequentially forming a first interfacial stability layer and an oxide semiconductor layer on the substrate having the source and drain electrodes; patterning the oxide semiconductor layer, thereby forming an active layer; forming a gate insulating layer on the substrate having the active layer; and forming a gate electrode on the gate insulating layer formed above the active layer, wherein the first interfacial stability layer is formed of an oxide having a band gap of 3.0 to 8.0 eV.

According to still another aspect of the present invention, a method of manufacturing a TFT includes: forming source and drain electrodes on a substrate; sequentially forming an oxide semiconductor layer and an interfacial stability layer on the substrate having the source and drain electrodes; patterning the interfacial stability layer and the oxide semiconductor layer, thereby forming an active layer; forming a gate insulating layer on the substrate having the active layer; and forming a gate electrode on the gate insulating layer above the active layer, wherein the interfacial stability layer is formed of an oxide having a band gap of 3.0 to 8.0 eV.

According to another aspect of the present invention, a flat panel display device having a TFT includes: a first substrate having a plurality of pixels, a plurality of TFTs and a plurality of first electrodes formed thereon, the pixels being defined by a plurality of first and second conductive lines, the TFTs controlling signals supplied to the respective pixels, and the first electrodes being respectively coupled to the TFTs; a second substrate having a second electrode formed thereon; and a liquid crystal layer injected into a space sealed between the first and second electrodes, wherein each of the TFTs includes: source and drain electrodes formed on the first substrate; an active layer made of an oxide semiconductor and partially overlapped with the source and drain electrodes; a gate electrode isolated from the active layer by a gate insulating layer; and an interfacial stability layer formed on one or both of top and bottom surfaces of the active layer, wherein the interfacial stability layer is formed of an oxide having a band gap of 3.0 to 8.0 eV.

According to another aspect of the present invention, a flat panel display device having a TFT includes: a first substrate having organic light emitting devices and TFTs formed thereon, the organic light emitting devices each including a first electrode, an organic thin film layer and a second electrode, and the TFTs controlling operations of the respective organic light emitting devices; and a second substrate disposed opposite to the first substrate, wherein each of the TFTs includes: source and drain electrodes formed on the first substrate; an active layer made of an oxide semiconductor and partially overlapped with the source and drain electrodes; a gate electrode isolated from the active layer by a gate insulating layer; and an interfacial stability layer formed on one or both of top and bottom surfaces of the active layer, wherein the interfacial stability layer is formed of an oxide having a band gap of 3.0 to 8.0 eV.

In a TFT according to aspects of the present invention, an interfacial stability layer is formed on one surface or both surfaces of an active layer. Since the interfacial stability layer containing an oxide has the same characteristic as a gate insulating layer and a passivation layer, chemically high interface stability is maintained. Since the interfacial stability layer has a band gap equal to or greater than that of the active layer, charge trapping is physically prevented. Accordingly, a change in electrical characteristics such as a change in threshold voltage is minimized by the high interface stability and electric charge mobility, and it is possible to prevent reliability from being lowered depending on temperature and time. When a TFT according to aspects of the present invention is applied to a flat panel display device, improved image quality can be implemented by stable electrical characteristics.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
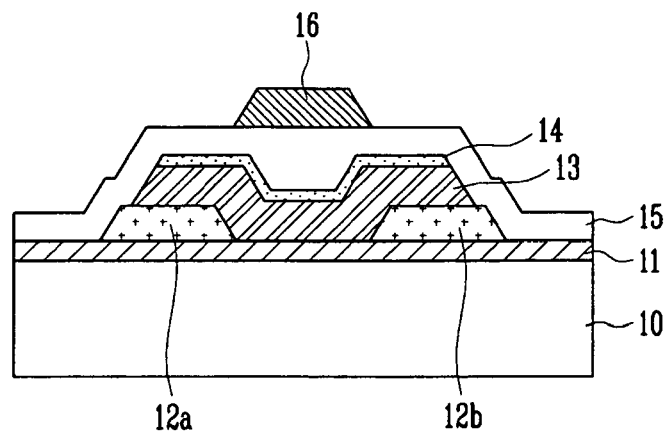
FIG. 1 is a cross-sectional view of a thin film transistor (TFT) according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on," "formed on," or "disposed on" another element, it can be directly on, formed directly on, or disposed directly on the element or one or more intervening elements may be disposed therebetween. Also, when an element is referred to as being "connected to," "coupled to," or "electrically coupled to" another element, it can be directly connected to the element or be indirectly connected to the element with one or more intervening elements interposed therebetween. Hereinafter, like reference numerals refer to like elements.

FIG. 1 is a cross-sectional view of a thin film transistor (TFT) according to an embodiment of the present invention, in which an example of the TFT having a top-gate structure is illustrated. A buffer layer 11 is formed on a substrate 10, and source and drain electrodes 12a and 12b are formed on the buffer layer 11. An active layer 13 made of an oxide semiconductor and an interfacial stability layer 14 are sequentially formed on the substrate 10 having the source and drain electrodes 12a and 12b. A gate insulating layer 15 is formed on the substrate 10 having the active layer 13, and a gate electrode 16 is formed on the gate insulating layer 15 above the active layer 13. Although not shown, the interfacial stability layer 14 may be formed wider than the active layer 13.

Figure 2:
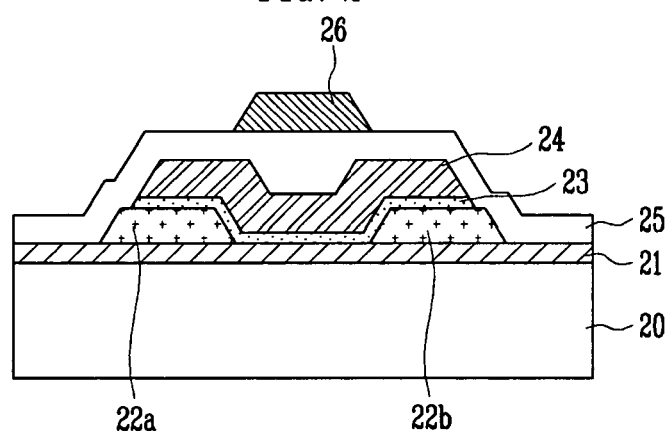
FIG. 2 is a cross-sectional view of a TFT according to an embodiment of the present invention.

FIG. 2 is a cross-sectional view of a TFT according to an embodiment of the present invention, in which another example of the TFT having a top-gate structure is illustrated. A buffer layer 21 is formed on a substrate 20, and source and drain electrodes 22a and 22b are formed on the buffer layer 21. An interfacial stability layer 23 and an active layer 24 made of an oxide semiconductor are sequentially formed on the substrate 20 having the source and drain electrodes 22a and 22b. A gate insulating layer 25 is formed on the substrate 20 having the active layer 24, and a gate electrode 26 is formed on the gate insulating layer 25 above the active layer 24. Although not shown, the interfacial stability layer 23 may be formed wider than the active layer 24.

Figure 3:
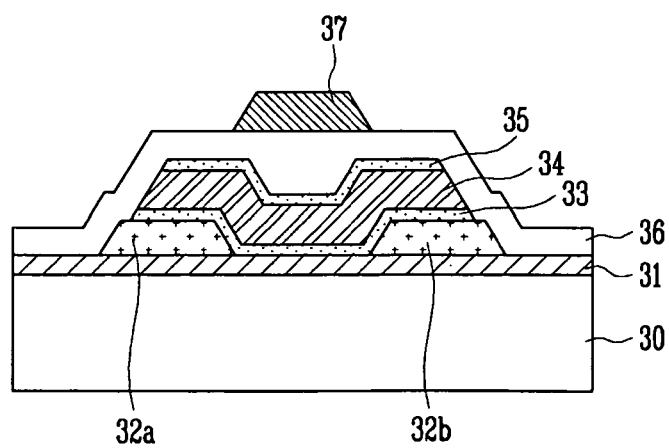
FIG. 3 is a cross-sectional view of a TFT according to an embodiment of the present invention.

FIG. 3 is a cross-sectional view of a TFT according to an embodiment of the present invention, in which still another example of the TFT having a top-gate structure is illustrated. A buffer layer 31 is formed on a substrate 30, and source and drain electrodes 32a and 32b are formed on the buffer layer 31. A first interfacial stability layer 33, an active layer 34 made of an oxide semiconductor, and a second interfacial stability layer 35 are sequentially formed on the substrate 30 having the source and drain electrodes 32a and 32b. A gate insulating layer 36 is formed on the substrate 30 having the active layer 34, and a gate electrode 37 is formed on the gate insulating layer 36 above the active layer 34. Although not shown, the first and/or second interfacial stability layers 33 and 35 may be formed wider than the active layer 34.

The active layer 13, 24, and 34 is disposed so that both side portions of the active layer 13, 24, and 34 are partially overlapped with the source and drain electrodes 12a and 12b, 22a and 22b, and 32a and 32b, respectively. A channel region of the active layer 13, 24, and 34 is overlapped with the gate electrode 16, 26, and 37. The oxide semiconductor of the active layers 13, 24, and 34 comprise zinc oxide (ZnO) and be doped with at least one ion of gallium (Ga), indium (In), tin (Sn), zirconium (Zr), hafnium (Hf), cadmium (Cd), silver (Ag), copper (Cu), germanium (Ge), gadolinium (Gd), and vanadium (V). For example, each of the active layers 13, 24, and 34 may be formed of ZnO, ZnGaO, ZnInO, ZnSnO, GaInZnO, CdO, InO, GaO, SnO, AgO, CuO, GeO, GdO, HfO, or the like.

The interfacial stability layer 14, 23, 33, and 35 comprises an oxide having a band gap equal to or greater than that of the active layer 13, 24 or 34, e.g., a band gap of 3.0 to 8.0 eV. The interfacial stability layer 14, 23, 33, and 35 comprises any one selected from the group consisting of $SiO_x$, $SiO_xN_y$, $SiO_xC_y$, $SiO_xC_yH_z$, $SiO_xF_y$, $GeO_x$, $GdO_x$, $AlO_x$, $GaO_x$, $SbO$, $ZrO_x$, $HfO_x$, $TaO_x$, $YO_x$, $VO_x$, $MgO_x$, $CaO_x$, $BaO_x$, $SrO_x$, and spin on glass (SOG).

As shown in FIGS. 1 to 3, the interfacial stability layer 14, 23, 33, and 35 is formed on one surface or both surfaces of the active layer 13, 24, and 34. Each of the interfacial stability layers 14, 23, 33, and 35 is formed of an oxide having a band gap of 3.0 to 8.0 eV. If the band gap of the interfacial stability layers 14, 23, 33, and 35 is smaller than that of the active layers 13, 24, and 34, e.g., 3.0 eV, electric charges are easily transferred, and therefore, carriers of the channel region of the active layer 13, 24, and 34 cannot be effectively used. If the band gap of the interfacial stability layer 14, 23, 33, and 35 is greater than 8.0 eV, electrical characteristics are lowered due to a high insulation characteristic. Since the interfacial stability layer 14, 23, 33, and 35 containing an oxide has the same characteristic as the gate insulating layer 15, 25, and 36 and a passivation layer (not shown), chemically high interface stability is maintained. Since the interfacial stability layers 14, 23, 33, and 35 have a band gap equal to or greater than that of the active layers 13, 24, and 34, charge trapping is physically prevented.

In order to increase an effect of preventing charge trapping, the effect [H], [OH⁻] concentration of the interfacial stability layer 14, 23, 33, and 35 is preferably adjusted to be less than $10^{19}/cm^3$. If the net electron concentration of the interfacial stability layer 14, 23, 33, and 35 from the remnant [H], [OH⁻] is higher than $10^{19}/cm^3$, hydrogen or hydroxyl atom/molecule/ion is penetrated (diffused) through a surface of the active layer 13, 24, and 34 to serve as a trap. For this reason, electrical characteristics of the active layer 13, 24, and 34 may be lowered. In order to adjust the [H] or [OH⁻] concentration of the interfacial stability layer 14, 23, 33, and 35 to be $10^{+19}/cm^3$ or lower, a physical deposition method, such as a sputtering deposition method, may be used rather than a chemical deposition method.

Since the interfacial stability layer 14, 23, 33, and 35 protects a channel region of the active layer 13, 24, and 34 and increases a curing effect in a subsequent heat treatment process, damage of the active layer 13, 24, and 34 can be recovered.

Preferably, the interfacial stability layer 23 and 33 disposed between the active layer 24 and 34, respectively, and the source and drain electrodes 22a and 22b and 32a and 32b are formed to a thickness of below 100 Å so that contact resistance between the active layer 13, 24, and 34 and the source and drain electrodes 22a and 22b and 32a and 32b can be maintained to be low. More preferably the interfacial stability layer 23 and 33 is formed to a thickness of 10 to 20 Å. Preferably, the interfacial stability layer 14 and 35 formed on the top surface of the active layer 13 and 34 is formed to have, for example, a thickness of 50 to 5000 Å so as to sufficiently protect the active layer 13 and 34 and to maintain interface stability.

Hereinafter, a method of manufacturing a TFT configured as described above according to aspects of the present invention will be described in detail with reference to FIGS. 4A to 4D. For convenience of illustration, the structure of FIG. 3 will be described as an example.

Figure 4A:
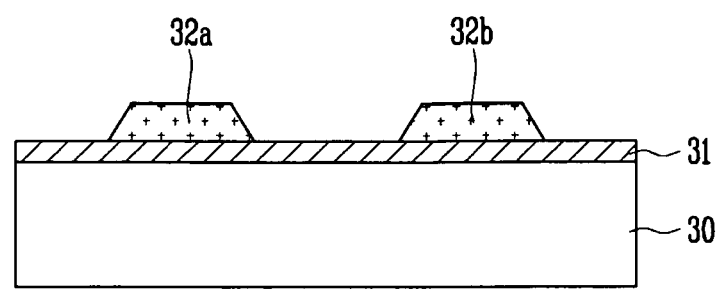
FIGS. 4A to 4D are cross-sectional views illustrating a method of manufacturing a TFT according to aspects of the present invention.

Referring to FIG. 4A, source and drain electrodes 32a and 32b are formed by forming a conductive layer on a substrate 30 using Mo, MoW, Al, AlNd, AlLiLa, or the like, and then patterning the conductive layer. A buffer layer 31 may be formed on the substrate 30 so as to prevent diffusion of impurities, and the source and drain electrodes 32a and 32b may be formed on the buffer layer 31. The substrate 30 may include a semiconductor substrate such as silicon (Si), an insulative substrate, such as glass or plastic, or a metal substrate.

Figure 4B:
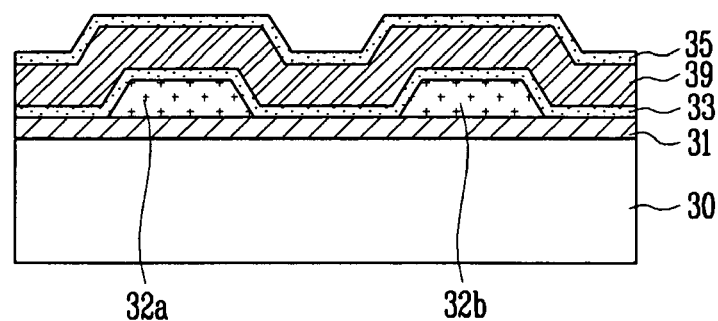

Referring to FIG. 4B, a first interfacial stability layer 33, an oxide semiconductor layer 39, and a second interfacial stability layer 35 are sequentially formed on the substrate 30 having the source and drain electrodes 32a and 32b. Each of the first and second interfacial stability layers 33 and 35 comprises an oxide having a band gap equal to or greater than that of the oxide semiconductor layer 39, e.g., a band gap of 3.0 to 8.0 eV. Each of the first and second interfacial stability layers 33 and 35 may include any one selected from the group consisting of $SiO_x$, $SiO_xN_y$, $SiO_xC_y$, $SiO_xC_yH_z$, $SiO_xF_y$, $GeO_x$, $GdO_x$, $AlO_x$, $GaO_x$, $SbO$, $ZrO_x$, $HfO_x$, $TaO_x$, $YO_x$, $VO_x$, $MgO_x$, $CaO_x$, $BaO_x$, $SrO_x$, and SOG.

A silicon oxide ($SiO_x$) or aluminum oxide ($AlO_x$) may be deposited using a physical method, such as a radio frequency (RF) or a direct current (DC) sputtering deposition method. When an aluminum oxide ($AlO_x$) is deposited using the RF sputtering deposition method, an oxygen ratio is adjusted to be about 4 to 10%, thereby forming the first and second interfacial stability layers 33 and 35 to have an excellent reliability against stresses, such as a temperature and a gate bias.

Figure 4C:
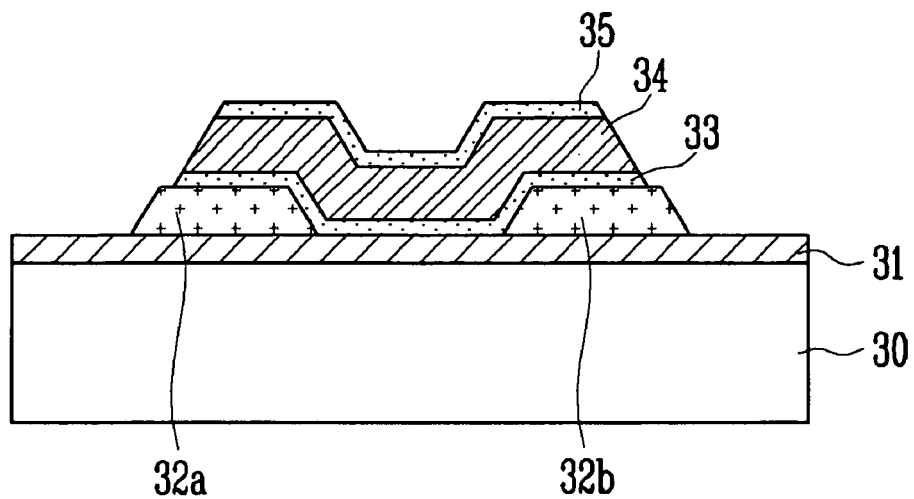

Referring to FIG. 4C, the oxide semiconductor layer 39 is formed into an active layer 34 by sequentially patterning the second interfacial stability layer 35, the oxide semiconductor layer 39, and the first interfacial stability layer 33. At this time, the first interfacial stability layer 33 formed on the bottom surface of the oxide semiconductor layer 39 may not be patterned, according to aspects of the present invention.

Figure 4D:
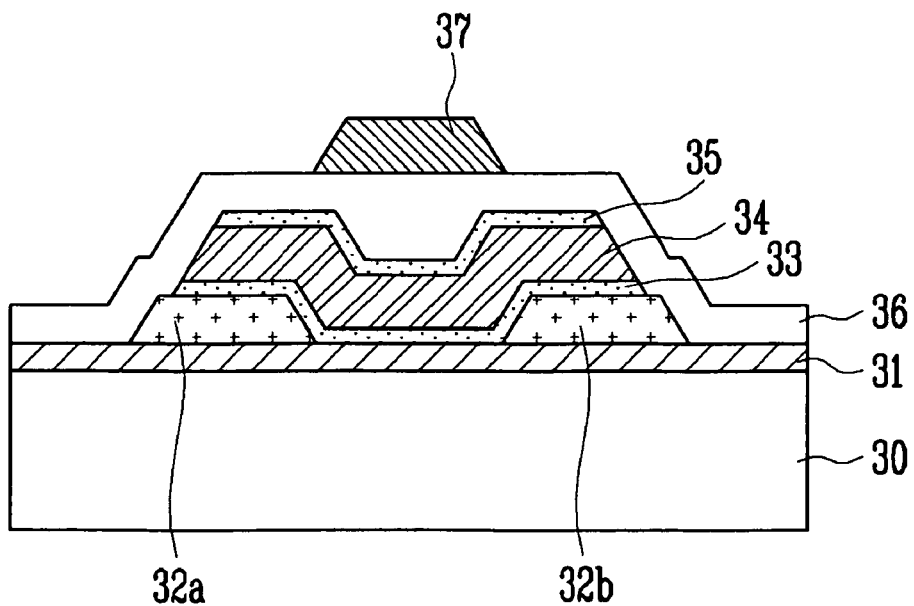

Referring to FIG. 4D, a gate insulating layer 36 is formed on the substrate 30 having the active layer 34, and the gate insulating layer 36 is formed of $SiO_2$, $SiN_x$, $GaO_3$, or the like. A gate electrode 37 is formed on the gate insulating layer 36 and formed above the active layer 34 by forming a conductive layer on the gate insulating layer 36 using Al, Cr, MoW, or the like, and then patterning the conductive layer.

Figure 5A:
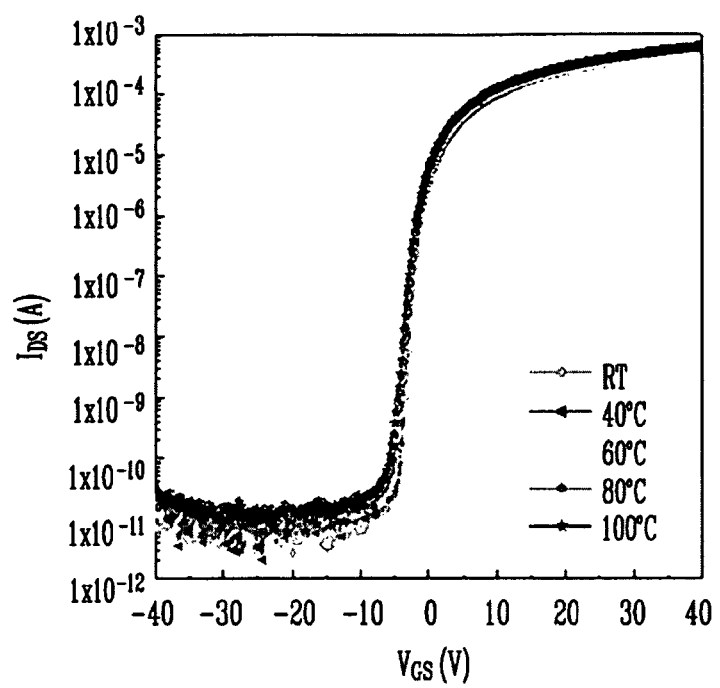
FIGS. 5A and 5B are graphs showing reliability measurement results of a TFT according to aspects of the present invention.
Figure 5B:
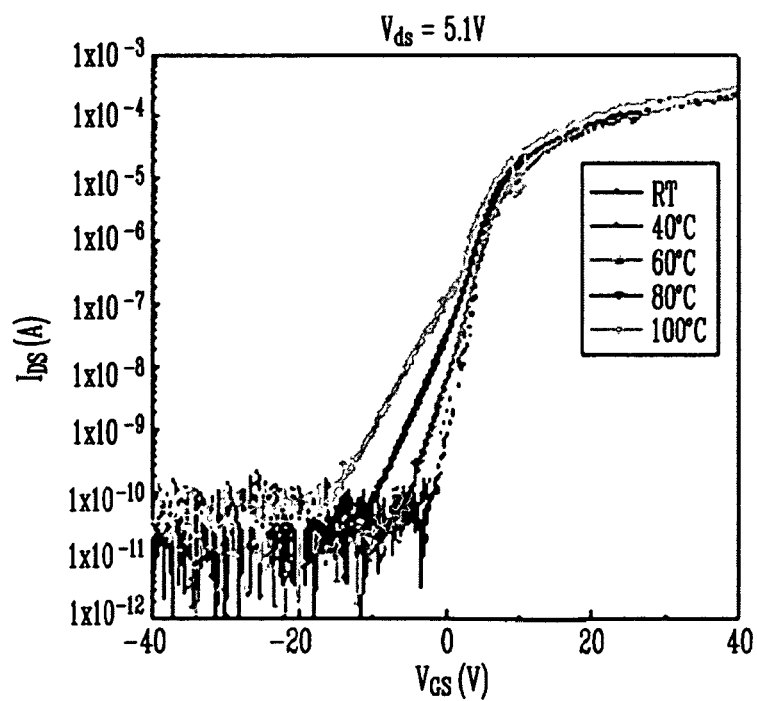

FIG. 5A is a graph showing reliability measurement results of a TFT according to aspects of the present invention in which an interfacial stability layer is formed using an aluminum oxide ($AlO_x$). Because a threshold voltage (Vth), a s-factor (sub-threshold slop-factor), and an off-current were hardly changed after a temperature was increased from a room temperature to 100° C., the TFT has an excellent reliability. FIG. 5B is a graph showing reliability measurement results of a TFT according to aspects of the present invention in which an interfacial stability layer is formed by depositing a silicon oxide ($SiO_x$) using a plasma enhanced chemical vapor deposition (PECVD). As a temperature increased, a threshold voltage (Vth) was changed in a negative direction, and a slop-factor was degraded.

Figure 6A:
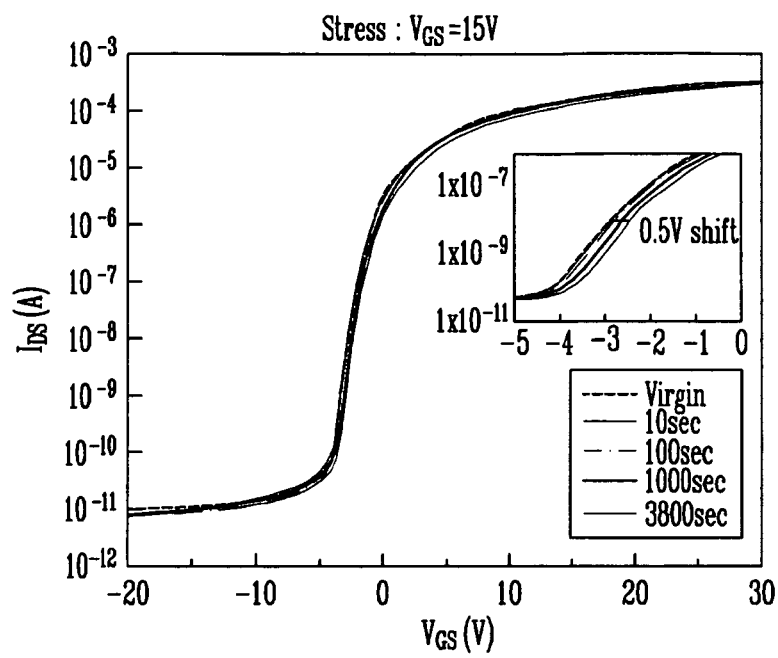
FIGS. 6A to 6C are graphs showing stress measurement results of a TFT according to aspects of the present invention.
Figure 6B:
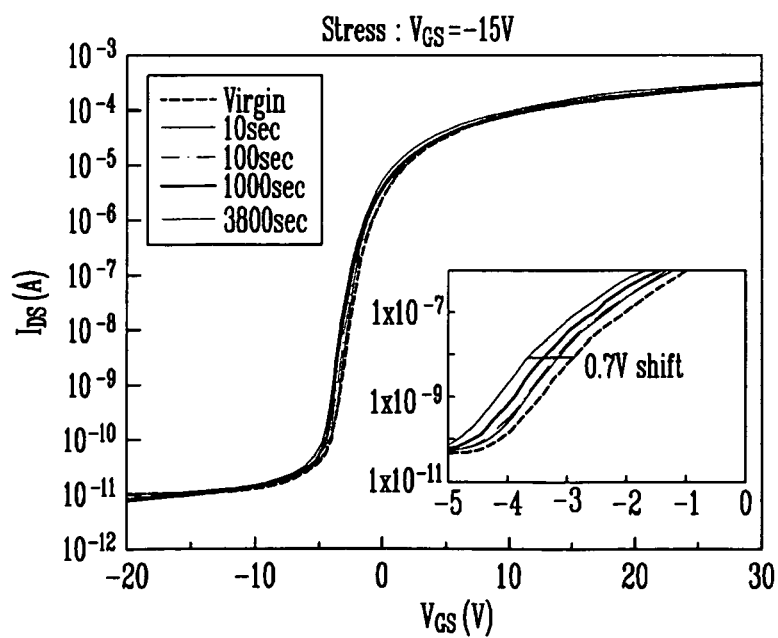
Figure 6C:
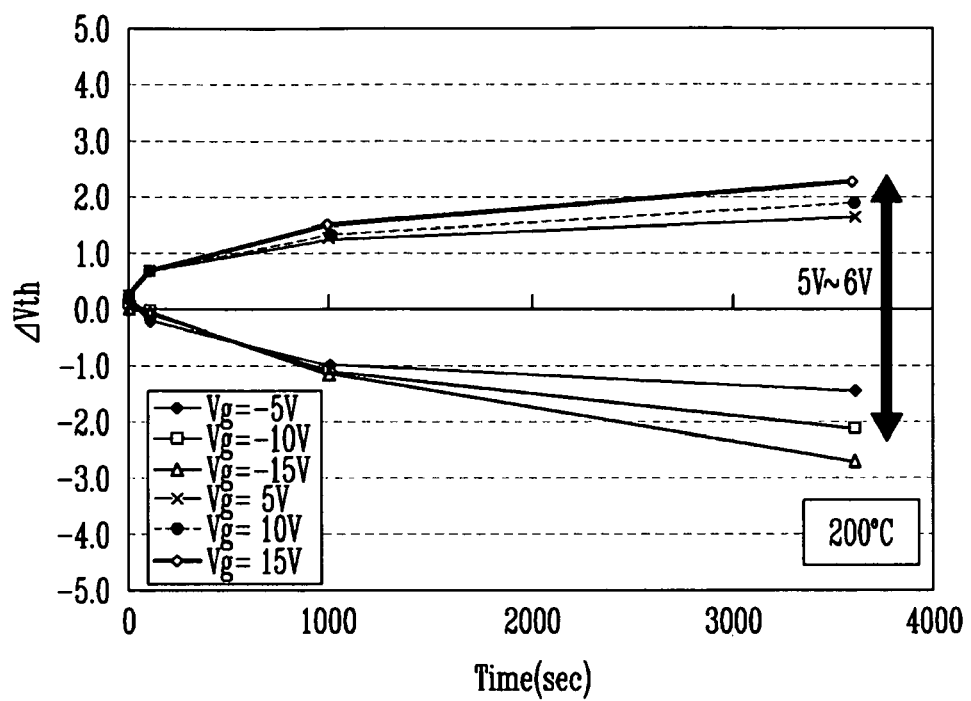

FIGS. 6A and 6B are graphs showing stress measurement results of a TFT according to aspects of the present invention. In FIG. 6A, a voltage $V_{GS}$ of 15V was applied to a gate electrode for 1 hour, and in FIG. 6B, a voltage $V_{GS}$ of −15V was applied to the gate electrode for 1 hour. In FIG. 6A, the change in threshold voltage (Vth) was 0.5V, and in FIG. 6B, the change in threshold voltage (Vth) was 0.7V. FIG. 6C is a graph showing stress measurement results of a TFT according to aspects of the present invention in which an interfacial stability layer is formed using a silicon oxide ($SiO_x$). The silicon oxide ($SiO_x$) is generally used in manufacturing a poly-silicon TFT, and a thermal oxide ($SiO_2$) formed at a temperature of 900° C. using a dry ($O_2$) or wet ($H_2O$) thermal oxidation method was used as the silicon oxide ($SiO_x$). When a voltage $V_{GS}$ of 15V was applied to a gate electrode for 1 hour, the change in threshold voltage (Vth) was 2.1V, and when a voltage $V_{GS}$ of −15V was applied to the gate electrode for 1 hour, the change in threshold voltage (Vth) was −2.8V. Therefore, it can be seen that reliability of the TFT is remarkably improved as compared with the conventional TFT through the results of FIGS. 6A, 6B, and 6C.

Figure 7:
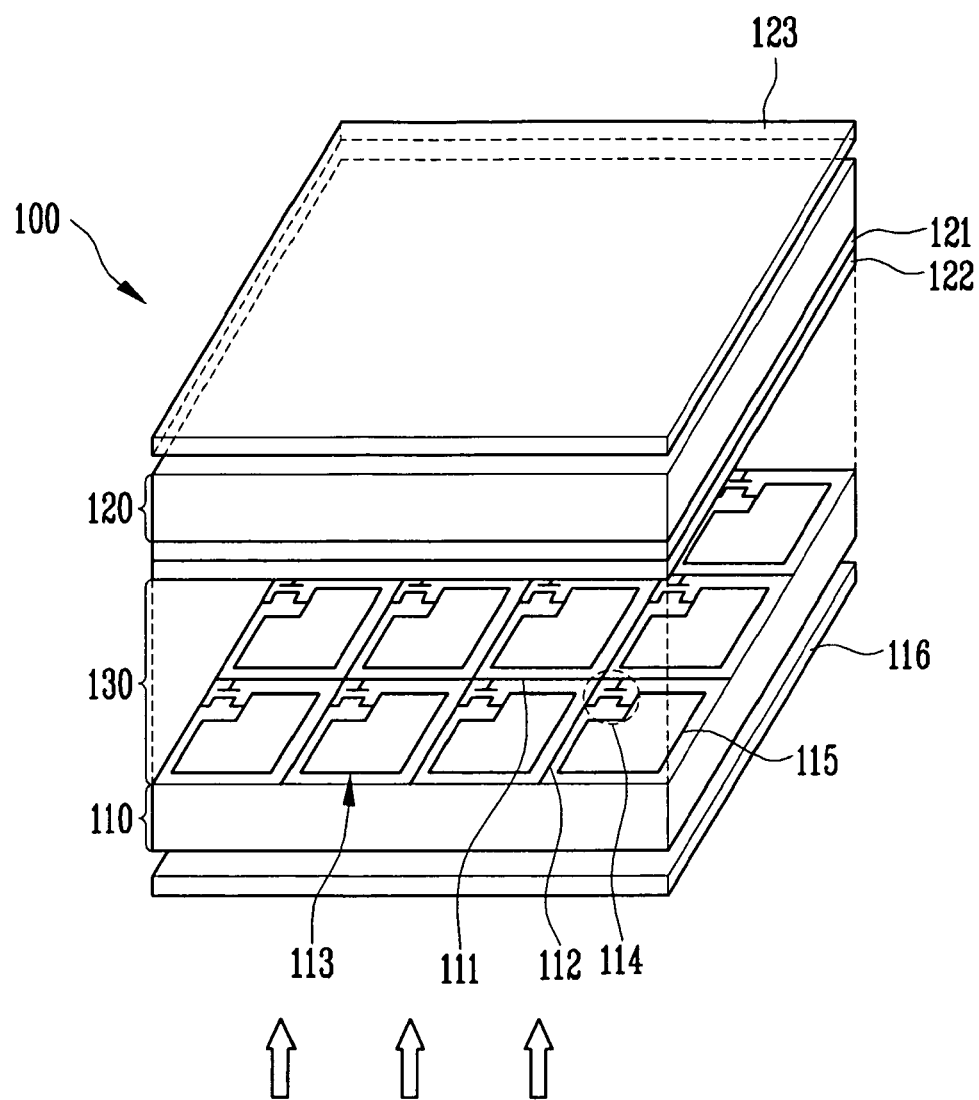
FIG. 7 is a perspective view showing an embodiment of a flat panel display device having a TFT according to aspects of the present invention.

A TFT according to aspects of the present invention may be applied to a flat panel display device. FIG. 7 is a perspective view showing an embodiment of a flat panel display device having a TFT according to aspects of the present invention. A display panel 100 displaying images will be schematically described.

The display panel 100 includes two substrates 110 and 120 disposed opposite to each other, and a liquid crystal layer 130 disposed between the two substrates 110 and 120. In the display panel 100, pixel regions 113 are defined by a plurality of gate and data lines 111 and 112 and are arranged in a matrix form.

A TFT 114 controls a signal supplied to each pixel and a pixel electrode 115 coupled to the transistor 114 is formed at each of the intersection portion of the gate and data lines 111 and 112 on the substrate 110. The TFT 114 has any one of the structures of FIGS. 1 to 3, and may be manufactured using the method of manufacturing a TFT, described with reference to FIGS. 4A to 4D.

A color filter 121 and a common electrode 122 are formed on the substrate 120. Polarizing plates 116 and 123 are formed at rear surfaces of the substrates 110 and 120, respectively, and a backlight (not shown) is disposed below a polarizing plate 116.

Meanwhile, a liquid crystal display (LCD) drive IC (not shown) driving the display panel 100 is mounted at a side of the pixel regions 113 of the display panel 100. The LCD drive IC converts electric signals provided from the outside of the display panel 100 into scan and data signals, and then supplies the converted scan and data signals to the gate and data lines 111 and 112.

Figure 8A:
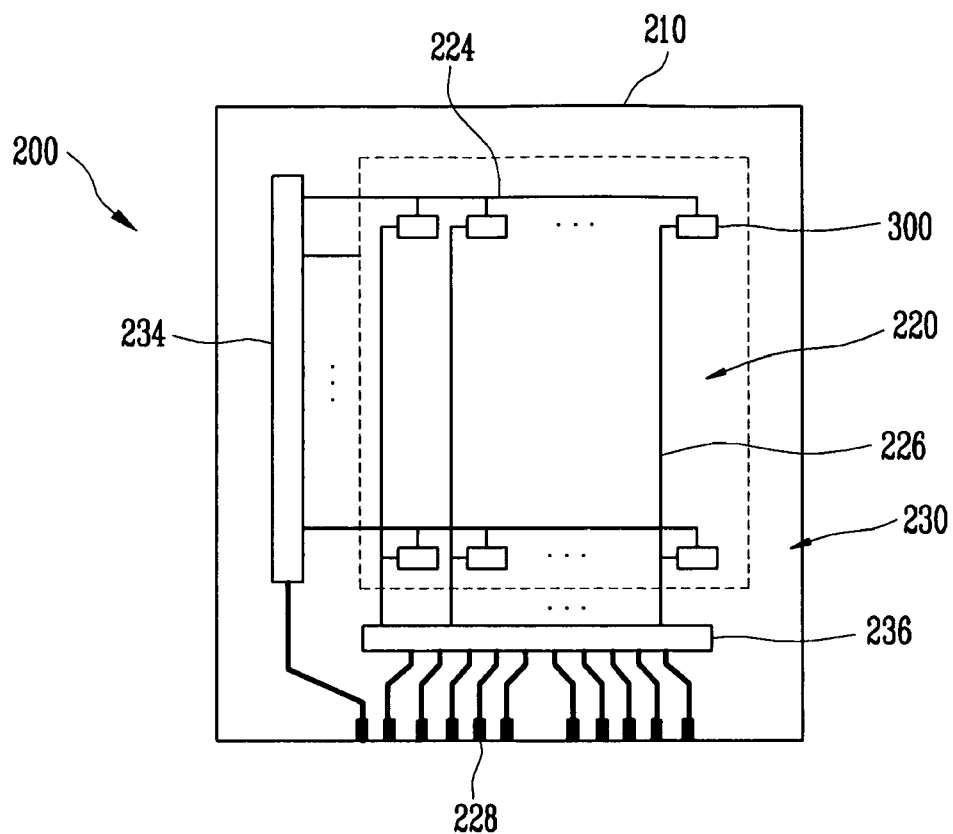
FIGS. 8A and 8B are respectively plan and cross-sectional views showing another embodiment of a flat panel display device having a TFT according to aspects of the present invention.
Figure 8B:
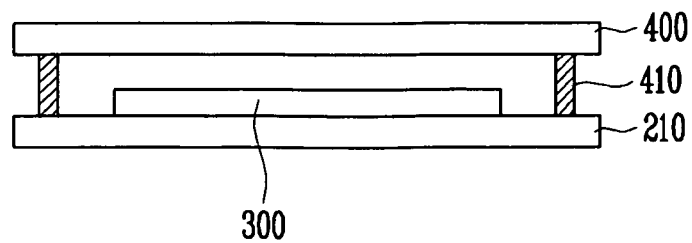

FIGS. 8A and 8B are respectively plan and cross-sectional views showing another embodiment of a flat panel display device having a TFT according to aspects of the present invention. A display panel 200 displaying images will be schematically described.

Referring to FIG. 8A, a substrate 210 is divided into a pixel region 220 and a non-pixel region 230 surrounding the pixel region 220. A plurality of organic light emitting devices 300 connected in a matrix form between scan and data lines 224 and 226 are formed on the substrate 210 of the pixel region 220. On the substrate 210 of the non-pixel region 230 are formed the scan and data lines 224 and 226 extended from the pixel region 220, a power supply line (not shown) operates the organic light emitting devices 300, and scan and data drivers 234 and 236, respectively, supply signals provided from the outside of the display panel 200 to the scan and data lines 224 and 226.

Figure 9:
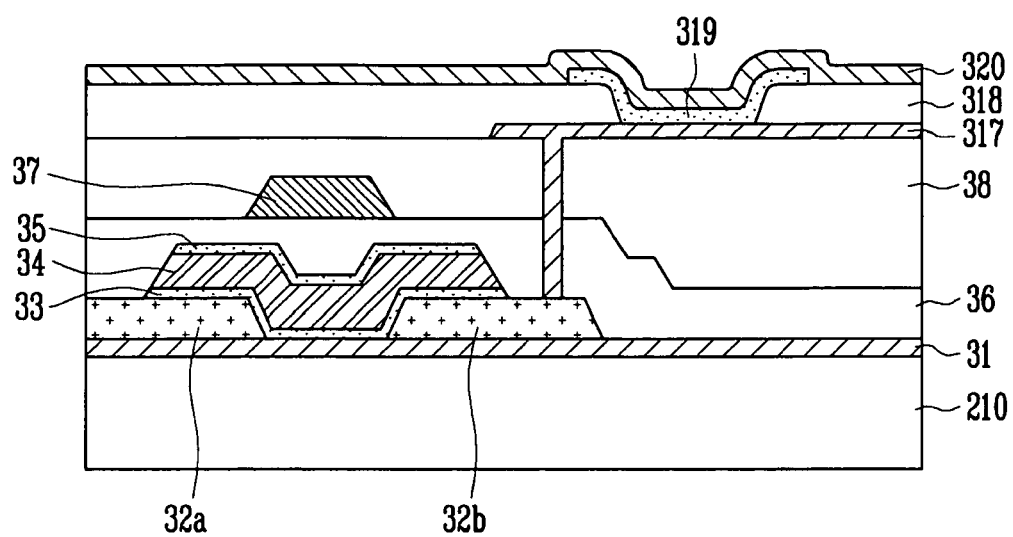
FIG. 9 is a cross-section view of an organic light emitting device of FIG. 8A.

Referring to FIG. 9, the organic light emitting device 300 includes an anode electrode 317, a cathode electrode 320 and an organic thin film layer 319 formed between the anode and cathode electrodes 317 and 320. The organic thin film layer 319 is formed to have a structure in which a hole transfer layer, an organic light emitting layer and an electron transfer layer are laminated. A hole injection layer, a hole blocking layer, an electron blocking layer, and an electron injection layer may be further included in the organic thin film layer 319. The organic light emitting device 300 may further include a TFT to control an operation of the organic light emitting device 300 and a capacitor to maintain signals.

The TFT may have any one of the structures of FIGS. 1 to 3, and may be manufactured using the method of manufacturing a TFT, described with reference to FIGS. 4A to 4D. Hereinafter, the organic light emitting device 300 including a TFT will be described in detail with reference to FIGS. 8A and 9.

A buffer layer is formed on the substrate 210, source and drain electrodes 32a and 32b are formed on the buffer layer 31 in the pixel region 220. At this time, a data line 226 coupled to one of the source and drain electrodes 32a and 32b are formed in the pixel region 220. The data line 226 may extend from the pixel region 220 and a pad 228 to receive signals provided from the outside of the display panel 200, and may be formed in the non-pixel region 230.

A first interfacial stability layer 33, an oxide semiconductor layer 39, and a second interfacial stability layer 35 are sequentially formed on the substrate 210 having the source and drain electrodes 32a and 32b. The second interfacial stability layer 35 and the oxide semiconductor layer 39 are patterned, sequentially or concurrently, thereby forming the active layer 34. A gate insulating layer 36 is formed on the substrate 210 having the active layer 39, and a gate electrode 37 is formed on the gate insulating layer 36 and formed above the active layer 39. At this time, a scan line 224 coupled to the gate electrode 37 is formed in the pixel region 220. The scan line 224 may be extended from the pixel region 220 and a pad 228 to receive signals provided from the outside of the display panel 300 may be formed in the non-pixel region 230.

A planarization layer 38 is formed above the thin film transistor described above, and a via hole is formed in the planarization layer 38 and the gate insulating layer 36 so that the source or drain electrode 32a or 32b is exposed. An anode electrode 317 is formed to be coupled to the source or drain electrode 32a or 32b through the via hole.

A pixel defining layer 318 is formed on the planarization layer 38 so that a region (a light emitting region) of the anode electrode 317 is exposed, and an organic thin film layer 319 is formed on the exposed anode electrode 317. A cathode electrode 320 is formed on the pixel defining layer 318 having the organic thin film layer 319.

Referring to FIG. 8B, a sealing substrate 400 sealing the pixel region 220 is disposed above the substrate 210 having the organic light emitting device 300, and the sealing substrate 400 is joined with the substrate 210 by a sealing member 410, thereby completing the display panel 200.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display device, comprising:
   a first substrate having disposed thereon:
      first and second conductive lines, the first conductive lines disposed to cross the second conductive lines,
      a plurality of pixels, each of the plurality of pixels having a first electrode and being defined by the first and second conductive lines, and
      a plurality of thin film transistors electrically coupled to the first electrodes to control signals supplied to the pixels, respectively;
   a second substrate having a second electrode formed thereon; and
   a liquid crystal layer disposed in a sealed space between the first and second electrodes,
   wherein each of the thin film transistors comprises:
      source and drain electrodes formed on the first substrate, one of the source and drain electrodes electrically coupled to one of the first and second conductive lines, and the other of the source and drain electrodes electrically coupled to the first electrode,
      an active layer formed of an oxide semiconductor and formed to at least partially overlap both the source and drain electrodes,
      a gate insulating layer formed on the first substrate to cover the active layer and the source and drain electrodes,
      a gate electrode formed on the gate insulating layer and insulated from the active layer by the gate insulating layer, the gate electrode electrically connected to the other of the first and second conductive lines, and
      an interfacial stability layer formed on at least one of top and bottom surfaces of the active layer, the interfacial stability layer being formed of an oxide having a band gap of 3.0 to 8.0 eV,
   wherein a portion of the interfacial stability layer is disposed between the source and drain electrodes and the active layer.

2. The flat panel display device of claim 1, wherein the oxide semiconductor comprises zinc oxide (ZnO).

3. The flat panel display device of claim 2, wherein the oxide semiconductor is doped with at least one ion of gallium (Ga), indium (In), tin (Sn), zirconium (Zr), hafnium (Hf), cadmium (Cd), silver (Ag), copper (Cu), germanium (Ge), gadolinium (Gd), and vanadium (V).

4. The flat panel display device of claim 1, wherein the interfacial stability layer comprises one selected from the group consisting of $SiO_x$, $SiO_xN_y$, $SiO_xC_y$, $SiO_xC_yH_z$, $SiO_xF_y$, $GeO_x$, $GdO_x$, $AlO_x$, $GaO_x$, $SbO$, $ZrO_x$, $HfO_x$, $TaO_x$, $YO_x$, $VO_x$, $MgO_x$, $CaO_x$, $BaO_x$, $SrO_x$, and SOG.

5. A flat panel display device, comprising:
   a first substrate having an organic light emitting device, gate and data lines, and a thin film transistor formed thereon, the organic light emitting device including a first electrode, an organic thin film layer, and a second electrode, and the thin film transistor controlling operation of the organic light emitting device; and
   a second substrate disposed opposite to the first substrate,
   wherein the thin film transistor comprises:
      source and drain electrodes formed on the first substrate, one of the source and drain electrodes electrically connected to one of the data lines,
      an active layer formed of an oxide semiconductor and formed to at least partially overlap both the source and drain electrodes,
      a gate insulating layer formed on the substrate to cover the active layer and the source and drain electrodes,
      a gate electrode formed on the gate insulating layer and insulated from the active layer by the gate insulating layer, the gate electrode electrically connected to one of the gate lines, and
      an interfacial stability layer formed on at least one of top and bottom surfaces of the active layer, the interfacial stability layer being formed of an oxide having a band gap of 3.0 to 8.0 eV,
   wherein a portion of the interfacial stability layer is disposed between the source and drain electrodes and the active layer.

6. The flat panel display device of claim 5, wherein the oxide semiconductor comprises zinc oxide (ZnO).

7. The flat panel display device of claim 6, wherein the oxide semiconductor is doped with at least one ion of gallium (Ga), indium (In), tin (Sn), zirconium (Zr), hafnium (Hf), cadmium (Cd), silver (Ag), copper (Cu), germanium (Ge), gadolinium (Gd), and vanadium (V).

8. The flat panel display device of claim 5, wherein the interfacial stability layer comprises one selected from the group consisting of $SiO_x$, $SiO_xN_y$, $SiO_xC_y$, $SiO_xC_yH_z$, $SiO_xF_y$, $GeO_x$, $GdO_x$, $AlO_x$, $GaO_x$, $SbO$, $ZrO_x$, $HfO_x$, $TaO_x$, $YO_x$, $VO_x$, $MgO_x$, $CaO_x$, $BaO_x$, $SrO_x$, and SOG.

* * * * *